United States Patent
Killat

(10) Patent No.: US 7,109,794 B2
(45) Date of Patent: Sep. 19, 2006

(54) DIFFERENTIAL GAIN STAGE FOR LOW VOLTAGE SUPPLY

(75) Inventor: Dirk Killat, Kirchheim/Teck (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 66 days.

(21) Appl. No.: 10/929,665

(22) Filed: Aug. 30, 2004

(65) Prior Publication Data

US 2006/0033571 A1    Feb. 16, 2006

(30) Foreign Application Priority Data

Aug. 13, 2004 (EP) .................................. 04392034

(51) Int. Cl.
*H03F 3/45* (2006.01)
(52) U.S. Cl. ...................... 330/253; 330/261
(58) Field of Classification Search ................... None
See application file for complete search history.

(56) References Cited

U.S. PATENT DOCUMENTS

| | | | |
|---|---|---|---|
| 4,794,349 A | 12/1988 | Senderowicz et al. ...... 330/253 |
| 4,835,488 A * | 5/1989 | Garuts ........................ 330/258 |
| 5,032,797 A * | 7/1991 | Mijuskovic ................. 330/253 |
| 5,434,538 A | 7/1995 | Lee et al. ...................... 330/84 |
| 5,631,606 A | 5/1997 | Tran ............................ 330/253 |
| 6,407,637 B1 | 6/2002 | Phanse et al. .............. 330/257 |
| 6,433,638 B1 | 8/2002 | Heineke et al. ............. 330/260 |
| 6,538,513 B1 | 3/2003 | Godfrey et al. ............. 330/258 |

FOREIGN PATENT DOCUMENTS

JP                55035542 A  *  3/1980

OTHER PUBLICATIONS

"Low Voltage Analog Circuit Design," by Rajput et al., in IEEE Circuits and Systems Magazine, vol. 2, No. 1, 1st Quarter 2002.

* cited by examiner

*Primary Examiner*—Robert Pascal
*Assistant Examiner*—Alan Wong
(74) *Attorney, Agent, or Firm*—Saile Ackerman LLC; Stephen B. Ackerman

(57) ABSTRACT

A new method and a circuit to improve the low voltage performance of a differential gain stage is achieved. The method comprises a monitoring stage and a differential stage. The monitoring stage comprises a differential transistor pair having first and second differential inputs, an upper current input, and a lower current output. In addition, a current source is connected to the upper current input, and a current load is connected to the lower current output. The differential stage comprises a differential transistor pair having first and second differential inputs, an upper current input, and first and second lower current outputs. In addition, a current source is connected to the upper current input, and first and second current loads are connected to the first and second lower current inputs. A current is forced through the monitoring stage current source. The current through the monitoring stage current source is mirrored in the differential stage current source. Current through the monitoring stage current load is mirrored through the differential transistor stage first and second current loads.

24 Claims, 7 Drawing Sheets

DIFFERENTIAL GAIN STAGE FOR LOW VOLTAGE SUPPLY

BACKGROUND OF THE INVENTION (1) Field of the Invention

The invention relates to an integrated circuit device, and, more particularly, to a differential gain stage capable of low voltage operation.

(2) Description of the Prior Art

Differential gain stages are used in a large variety of electronics circuits. Differential gain stages provide a means of buffering signals and of multiplying voltage and/or current differences between signals. Differential gain stages are one of the key functional features in operational amplifier and/or comparator designs. Differential gain stages typically comprise a pair of transistors. These transistors may be bipolar or MOS.

Referring now to FIG. 1, an example of a prior art differential stage circuit 10 is shown. This differential stage circuit comprises a differential stage 14 and a folded cascode structure 22. The differential stage 14 further comprises a differential pair made up of a first MOS transistor 26 and a second MOS transistor 28, a current source 16 made up of a MOS transistor 24, and a current load 20 made up of a first MOS transistor 30 and a second MOS transistor 32. The folded cascode circuit 22 comprises transistors 34, 36, 38, and 40. In the differential stage 14, a first bias voltage VBP controls the current source transistor 24, and a second bias voltage VBN controls the current load transistors 30 and 32.

During normal operation, the current flowing to the current source transistor 24 is divided between each side of the differential pair 26 and 28 based on the relationship between the first input voltage VI1 and the second input voltage VI2. If VI1 and VI2 are equal, then the current flowing through the current source 24 is divided equally between each side. As a result, the first and second current load transistors 30 and 32 conduct the same amount of current. Because the first and second current load transistors 30 and 32 are biased with the same gate voltage, the voltage outputs VC1 and VC2 of the differential stage 14 are balanced to the same value. The differential stage 14 uses the transconductance of the differential pair transistors 26 and 28 to generate a transfer gain from the input voltage differential to the output voltage differential.

The differential stage 14 relies on an adequate power supply voltage, that is, the voltage difference between VDD and VSS. If the supply voltage drops to a very low level of, for example, about 1 V and, further, if the threshold voltage of the MOS transistors is about 0.65 V, then several problems may occur. First, the current source transistor 24 may come out of saturation mode. As a result, the current flowing through the differential pair 26 and 28 will not be constant over small fluctuations in the power supply voltage. This will cause the differential stage to perform incorrectly unless the voltage bias VBN of the current load transistors 30 and 32 compensates for this problem. Second, the small voltage difference between the power supply and the threshold voltage of the MOS transistors will limit the common mode operating range of the differential pair transistors 26 and 28.

Referring now to FIG. 2, an example of a differential stage 54 used in a common mode regulation circuit 50 is shown. The differential stage 54 again comprises a differential pair 58 and 60, a current source 56, and first and second current loads 62 and 64. The current source 56 is again controlled by a first voltage bias VBP, and the first and second current loads 62 and 64 are controlled by a second current bias VBN. However, in this case, an additional operational amplifier 66 is used to provide a feedback control mechanism between the differential stage outputs VC1 and VC2 and a reference voltage VREF generated by a diode connected transistor 68 conducting a reference current IREF 70. Once again, this application 50 of the differential stage 54 will perform incorrectly at very low voltages if the current source transistor 56 comes out of saturation. Therefore, if the differential pair transistors 58 and 60 do not operate properly due to an inadequate difference between the power supply voltage and the threshold voltage. Reducing the minimum operating voltage of the differential stage is a principal object of the present invention. In addition, the supply voltage to the operational amplifier 66 is also very low. Therefore, this operation amplifier 66 shares the same problems with low supply voltage as the differential stage 54.

Several prior art inventions relate to differential gain stages and amplifiers. U.S. Pat. No. 6,433,638 to Heineke et al teaches a transimpedance amplifier using MESFET devices where a matched pair of source-coupled transistors worse have sources connected to ground to thereby enable low voltage operation. U.S. Pat. No. 6,407,637 to Phanse et al teaches a differential current mirror system with excellent common mode rejection ratio. U.S. Pat. No. 6,538,513 to Godfrey et al teaches an amplifier with common mode output control. U.S. Pat. No. 5,631,606 to Tran et al teaches a differential output CMOS amplifier. In the article, "Low Voltage Analog Circuit Design," by Rajput et al, in IEEE Circuits and Systems Magazine, Volume 2, Number 1, 1st Quarter 2002, a low voltage analog design technique is shown.

SUMMARY OF THE INVENTION

A principal object of the present invention is to provide an effective and very manufacturable circuit device.

A further object of the present invention is to provide a differential stage circuit device.

A yet further object of the present invention is to provide a differential stage circuit device capable of very low voltage operation.

A yet further object of the present invention is to provide a differential stage circuit device with bulk forward biasing of the differential MOS transistor pair to improve low voltage performance.

A yet further object of the present invention is to provide a differential stage circuit device with compensation for variation in current source performance due to low voltage headroom.

A yet further object of the present invention is to provide a differential stage circuit device with compensation for variation in parasitic bipolar current due to bulk forward biasing.

Another further object of the present invention is to provide a method to provide low voltage operation of a differential stage circuit device.

In accordance with the objects of this invention, a method to improve the low voltage performance of a differential gain stage is achieved. The method comprises providing a monitoring stage and a differential stage. The monitoring stage comprises a differential transistor pair having a first differential input, a second differential input, an upper current input, and a lower current output. In addition, a current source is connected to the upper current input, and a current load is connected to the lower current output. The differential stage comprises a differential transistor pair having a first differential input, a second differential input, an upper current input, a first lower current output, and a second lower current output. In addition, a current source is connected to the upper current input, a first current load is connected to the first lower current input, and a second current load is connected to the second lower current input. A current is forced through the monitoring stage current source. The current through the monitoring stage current source is mirrored in the differential stage current source. Current through the monitoring stage current load is mirrored through the differential transistor stage first and second current loads. The monitoring stage and the differential stage first differential inputs are forced to the same voltage. The monitoring stage and the differential stage second differential inputs are forced to the same voltage.

Also in accordance with the objects of this invention, a differential gain stage device is achieved. The device comprises a monitoring stage and a differential stage. The monitoring stage comprises a differential transistor pair having a first differential input, a second differential input, an upper current input, and a lower current output. In addition, a current source is connected to the upper current input, and a current load is connected to the lower current output. The differential stage comprises a differential transistor pair having a first differential input, a second differential input, an upper current input, a first lower current output, and a second lower current output. In addition, a current source is connected to the upper current input, a first current load is connected to the first lower current output, and a second current load is connected to the second lower current output. The gate of the monitoring stage current source and the gate of the differential stage current source are commonly connected to a first voltage bias. The monitoring stage current load is a diode connected transistor that generates a second voltage bias. The gates of the differential stage first and second current loads are each connected to the second voltage bias.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose differential stage circuit devices and methods. These devices and methods provide a differential stage circuit capable of very low voltage operation. It should be clear to those experienced in the art that the present invention can be applied and extended without deviating from the scope of the present invention.

Figure 1:
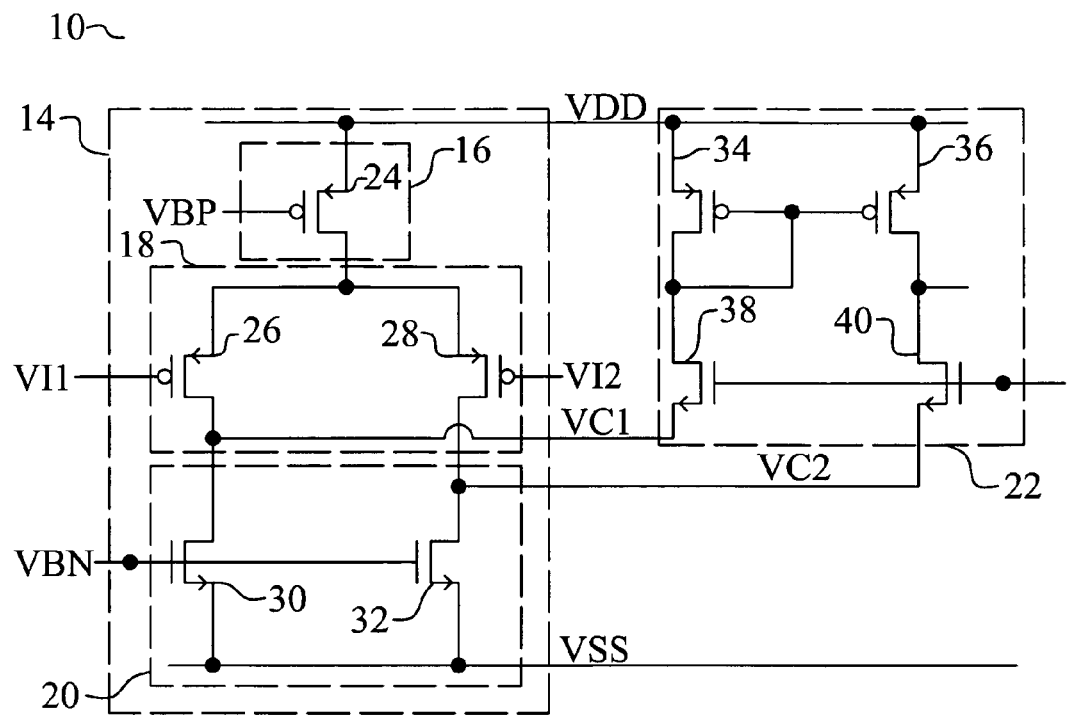
FIG. 1 illustrates a prior art differential gain stage with a folded cascode output section.
Figure 2:
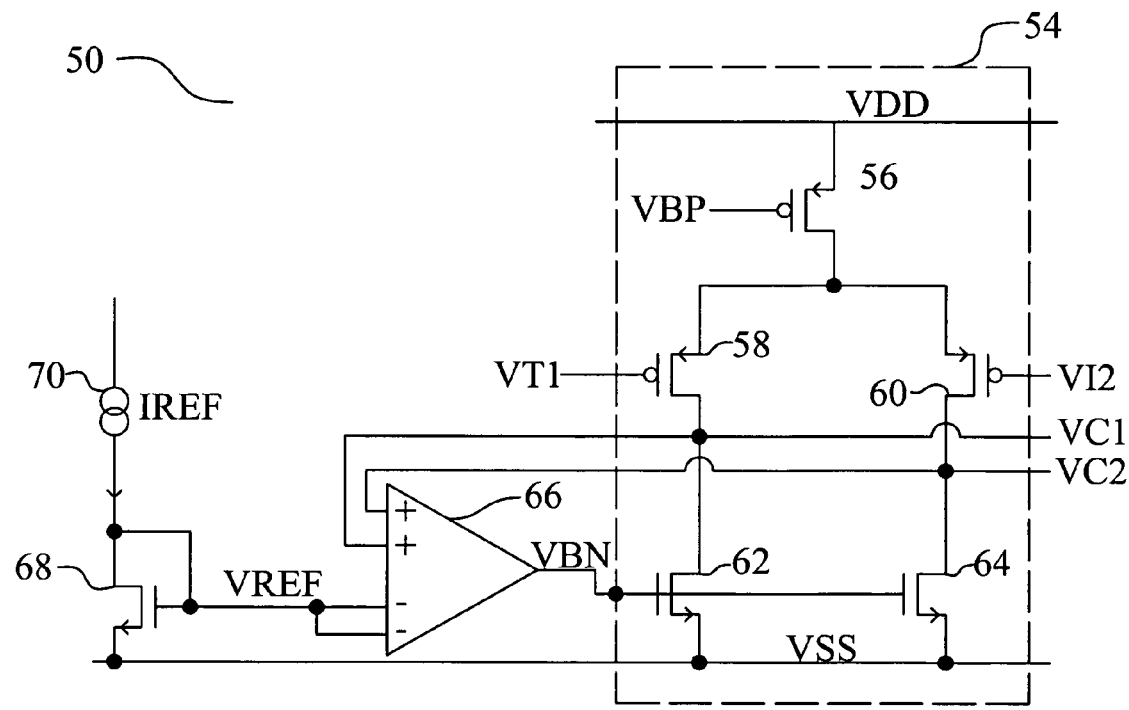
FIG. 2 illustrates a prior art differential gain stage for use in common mode regulation.
Figure 3:
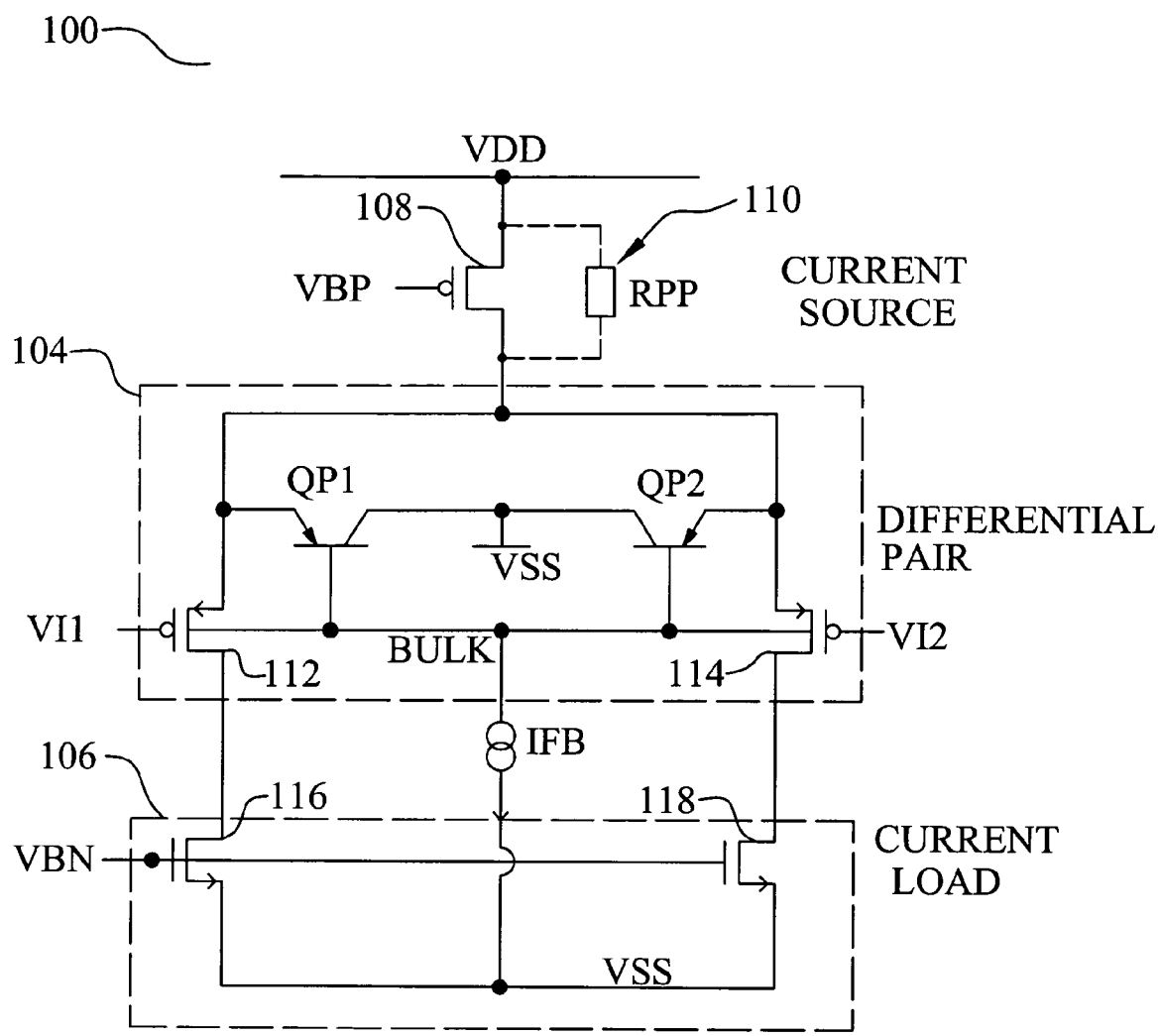
FIG. 3 illustrates a first preferred embodiment of the present invention showing a differential stage with bulk forward biasing to reduce the threshold voltage of the pair of differential transistors.

Referring now to FIG. 3, a first preferred embodiment of the present invention is illustrated. Several important features of the present invention are shown and discussed below. The first preferred embodiment of the present invention is a differential stage circuit 100 capable of very low voltage operation. In particular, the differential stage circuit 100 comprises a differential transistor pair 104 further comprising a first transistor 112 and a second transistor 114. In this embodiment, the transistor pair 104 comprises MOS transistors, and more preferably comprises PMOS transistors 112 and 114. The sources of the PMOS transistors 112 and 114 are connected together to form a current input node. A current source transistor 108 is connected between power supply VDD and the current input node. The current source transistor 108 also preferably comprises a PMOS transistor. The current source transistor 108 is controlled by a first bias voltage VBP. A pair of current load transistors 116 and 118 forms the current load 106 for the differential pair 104. The current load transistors 116 and 118 preferably comprise NMOS transistors. The current load transistors are controlled by a second bias voltage VBN. Alternatively, the PMOS and NMOS transistors may be reversed to generate a complimentary version of the above circuit 100 as is well known in the art.

As a particularly important feature of the present invention, the bulk terminal of each PMOS transistor 112 and 114 in the differential pair 104 is connected to a forward biasing current source IFB that is further connected to the ground reference VSS. The forward biasing of the bulk terminals BULK lowers the threshold voltage of the differential pair input transistors 112 and 114. As a result the input transistors 112 and 114 can operate over a wider voltage ranges than would be possible given a low operating voltage VDD and nominal threshold voltage. However, the forward bias current IFB additionally activates parasitic PNP bipolar transistors QP1 and QP2 formed by the p-type source terminals, the n-type bulk terminals, and the p-type substrate. That is, the forward bias current IFB generates a forward bias between the p-type source and the n-type bulk of each transistor in the differential pair 104. Base to emitter current in the parasitic PNP devices QP1 and QP2 will further generate collector to emitter current flowing into the p-type substrate connected to the reference voltage VSS. If this substrate current varies, for example, variation in the gain (β) of the parasitic bipolar transistors, temperature, and power supply voltage VDD will cause variation in the bias current from the current source 108 that will be diverted into the substrate. This will result in a gain error. Although the forward bias current IFB improves the low voltage operation of the differential pair, a means to compensate for variation in the parasitic current must be provided. In addition, the improved circuit 100 does not compensate for current source 108 variation due to loss of saturation. In a loss of saturation condition, the current source transistor 108 behaves as a resistor, as shown by the equivalent resistor RPP. Voltage variation in the power supply VDD with therefore create a linear variation in the current source value. The improved circuit 100 does not compensate for this variation.

As an important feature, a strong forward bias current (IFB) is used. The forward bias current IFB is strong enough to cause a forward bias voltage between the source and bulk of the differential transistors 112 and 114 of about 600 mV at room temperature. For example, the forward bias current IFB for a transistor with a width-to-length (W/L) ratio of about 10 μm/0.5 μm could be about 1 μA. This forward bias current represents an emitter-to-base current of the parasitic bipolar transistor QP1 or QP2. A typical value of the current gain (β) of these parasitic bipolar transistors is about 3. Therefore, about three times the forward bias current is flowing from source to substrate due to parasitic transistor action. This parasitic current significantly reduces the drain current flowing through the differential transistors 112 and 114. If the sum of the drain currents of transistors 112 and 114 changes, then the bias voltage VBN for the current load transistors 116 and 118 must compensate for this change to keep the output nodes VC1 and VC2 in the right operating point.

Several additional features should be noted. First, the parasitic bipolar transistors QP1 and QP2 are shown for clarity of understanding. It should be understood that these transistors are parasitic devices that are created due to the interrelationships between doped regions in the integrated circuit substrate. These devices are not designed into the circuit, per se. Further, the circuits of the present invention are useful in extended operation at low voltage even without the presence of the parasitic bipolar devices. Second, the parasitic resistor RPP 110 on the current source transistor is also included for clarity of understanding and is not designed into the circuit, per se. Third, the current source transistor 108 may alternatively comprise a bipolar transistor. Fourth, the current load transistors 116 and 118 may alternatively comprise bipolar transistors. Fifth, any or all of the transistors 108, 112, 114, 116, and 118 may alternatively comprise high voltage transistors. That is, thick gate transistors, or drain extension devices may be used in the circuit.

Figure 4:
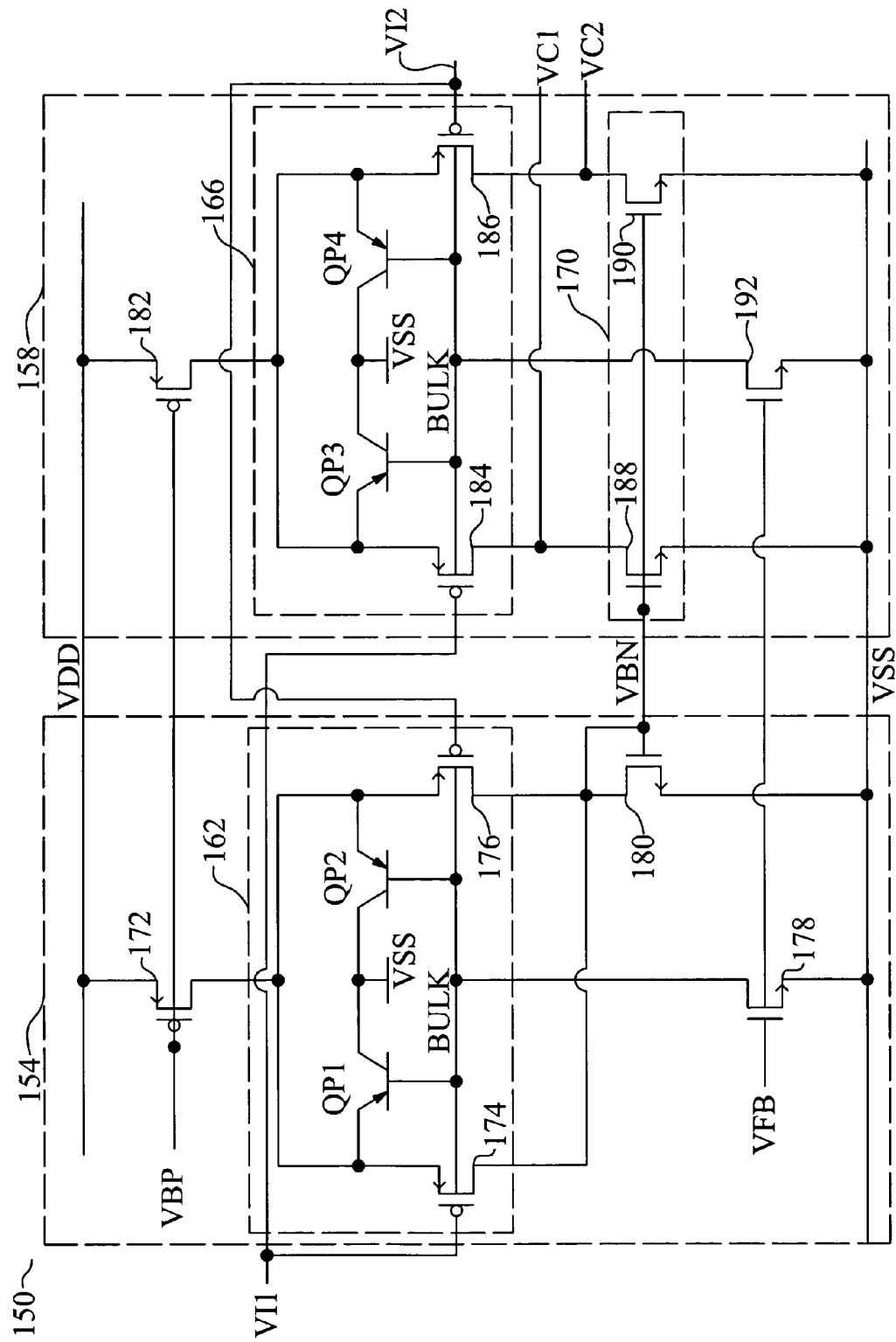
FIG. 4 illustrates a second preferred embodiment of the present invention showing a differential stage and a monitoring stage each with bulk forward biasing where the monitoring stage compensates for low voltage operating conditions.

Referring now to FIG. 4, a second preferred embodiment of the present invention is illustrated. In this embodiment, a means for compensating the variation in current source performance and parasitic substrate current is achieved. This differential stage circuit 150 comprises a monitoring stage 154 and a differential pair stage 158. The differential pair stage 158 is essentially the same as that shown in the first embodiment in FIG. 3. In particular, a differential pair 166 comprises common source connected first and second transistors 184 and 186. The gates of the first and second transistors 184 and 186 are connected to the first and second differential inputs VI1 and VI2, respectively. A current source transistor 182 is connected to the current source input of the differential pair 166. A current load 170 comprising first and second transistors 188 and 190 is connected to the drains of the differential pair transistors 184 and 186 to form the output voltage signals VC1 and VC2. The forward bias current source is formed by the transistor 192 connected between the bulk terminals BULK of the differential pair 184 and 186 and the ground reference VSS. The differential pair current source transistor 182 is again controlled by a first bias voltage VBP. The current load transistors 188 and 190 are again controlled by a second bias voltage VBN.

As a particularly important feature of the present invention, a monitoring stage 154 is included. The monitoring stage 154 comprises a differential pair 162, a current source 172, a current load 180, and a forward bias current source 178. In particular, the differential pair 162 comprises the same type and size transistors 174 and 176 as are used in the differential pair of the differential pair stage 166. The differential pair 162 of the monitoring stage 154 is constructed to mirror the operating characteristics of the differential pair 166 in the differential pair stage 158. That is, the differential pair transistors 174 and 176 are common source connected, are bulk forward biased, and are connected to the first and second input signals VI1 and VI2, respectively. As further mimicking features, the current source transistor 172 is the same type, size, and construction as the current source transistor 182 in the differential pair stage 158. Further, the monitoring current source transistor 172 is biased to the first bias voltage VBP as in the differential pair stage 58. In addition, the forward bias current source transistor 178 is controlled by the same voltage VFB as the forward bias current source transistor 192 in the differential pair stage 158. Finally, current scaling is possible between the monitoring stage 154 and the differential stage 158. For example, to save chip area and power supply current, the monitor stage 154 may be made a fraction (e.g. half) of the size of the differential stage 158 by properly scaling all of the transistor devices. The current through the forward bias current source transistor 178 of the monitor stage 154 would then be half the current through the differential stage 158 current source 192.

The current load for the monitoring stage 154 comprises a single transistor 180. Further, this current load transistor 180 is diode connected such that the second bias voltage VBN is generated by this transistor 180. This is a significant feature because it allows the monitoring stage 154 to compensate for the aforementioned low power supply voltage effects. In particular, the current load device 180 will conduct the sum of the drain currents of the first and second transistors 174 and 176 of the monitoring differential pair 162. As described above, under normal conditions the sum of the drain currents of the pair of transistors 174 and 176 will equal the current supplied by the current source transistor 172. However, the forward bias current source 178 will cause a part of this current to be diverted to the substrate supply VSS through the parasitic bipolar transistors QP1 and QP2. As a result of this parasitic current diversion, the second bias voltage VBN will be reduced. In addition, if the current source transistor 172 leaves the saturation state due to a low voltage supply VDD, then the combined drain currents in the transistor pair 174 and 176 will be reduced and will again lead to a reduction in the second bias voltage VBN.

In either of the above cases, the second bias voltage VBN provides a means to detect and to compensate for drain current variation in the differential pair 166. As a further important feature, the second bias voltage VBN is used to control the current load 170 and, particularly, the load transistors 188 and 190 in the differential pair stage 158. As a result, the monitoring circuit provides a means to increase or to decrease the current load 170 for the differential pair stage 158 and to thereby maintain optimal circuit characteristics in the differential pair stage over a range of power supply voltage including low voltage operation. In addition, the monitoring stage 154 sets the common mode operating point of the differential pair input stage 158. The bias conditions are established even if the differential pair input stage 158 is used in a fully differential configuration. The current load is regulated even if a variable part of the source current flows to the substrate due to the parasitic bipolar effects. Finally, a large common mode input range is achieved even while using standard voltage threshold transistors.

Figure 5:
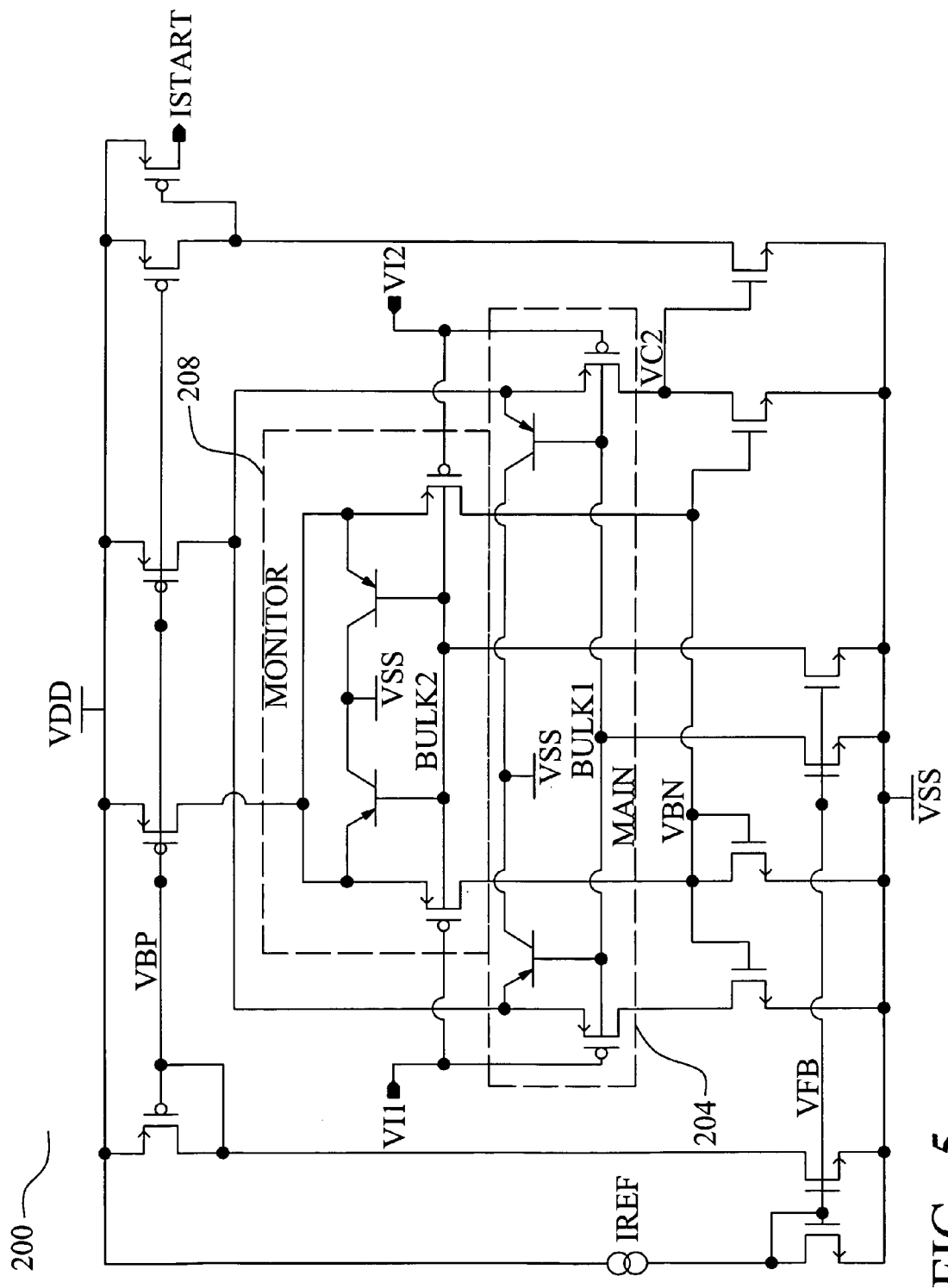
FIG. 5 illustrates a third preferred embodiment of the present invention showing a comparator for low voltage startup of a bandgap circuit.

Referring now to FIG. 5, a third preferred embodiment 200 of the present invention illustrated. In this case the differential pair stage 204 is used in a comparator or for low voltage startup of a bandgap reference. The differential pair stage 204 and the monitoring stage 208 are constructed as described before. In this case, the first bias voltage VBP, used to control the current source, and the forward bias voltage VFB, used to control before bias current source, are generated from a current reference IREF. The second bias voltage VBN is again generated by the monitoring stage 208 and provides a means to compensate the differential pair stage 204 over voltage and parasitic current conditions. The output VC2 of the differential pair stage 204 provides the startup control for the bandgap section to generate the bandgap bias voltage VBIAS.

Figure 6:
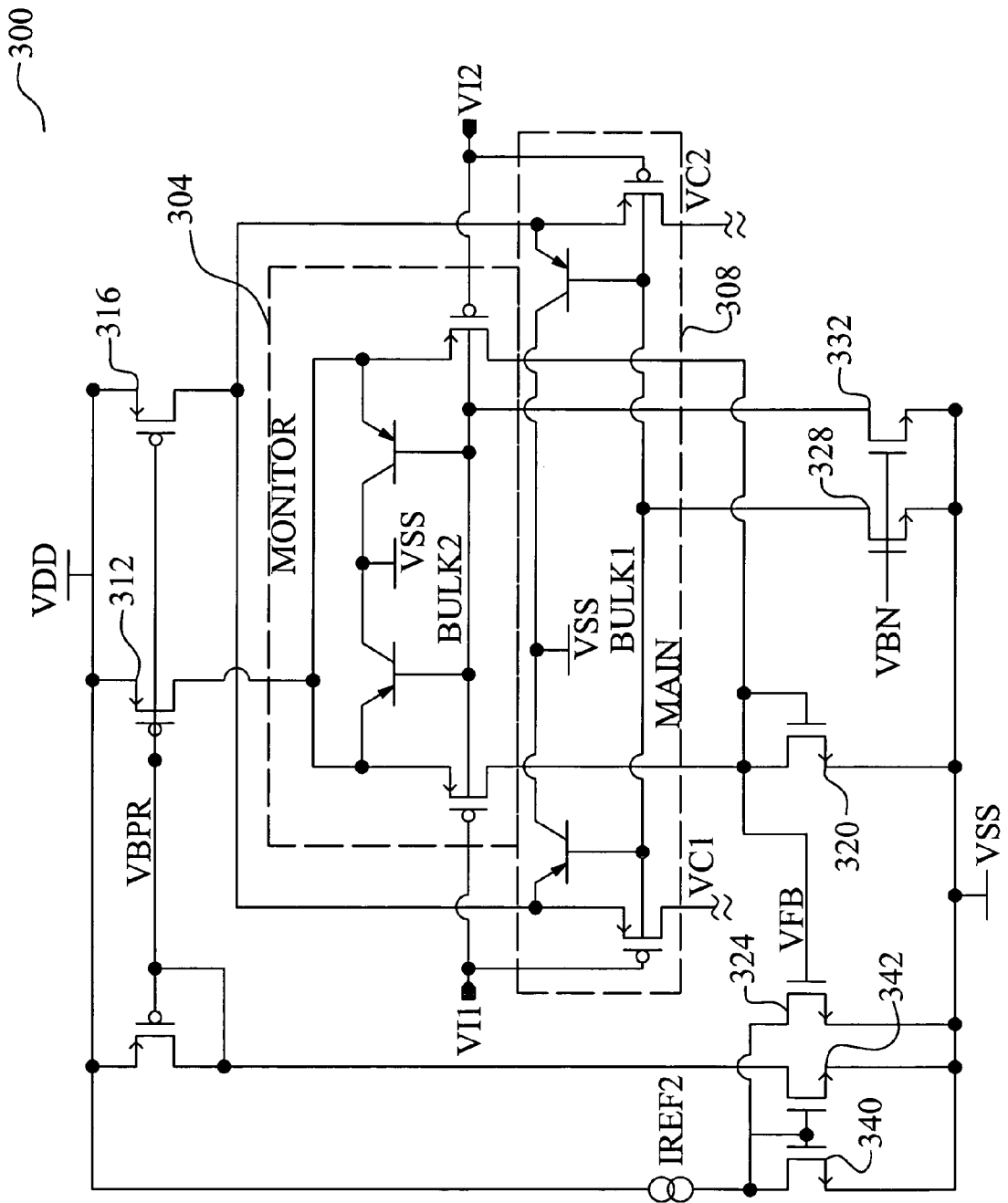
FIG. 6 illustrates a fourth preferred embodiment of the present invention showing a circuit for the regulation of the bias currents for the monitor and main stages.

Referring now to FIG. 6, a fourth preferred embodiment of the present invention is shown. In this variation of the circuit, the input currents of the differential stage MAIN and the monitor stage MONITOR are regulated. Variation in low current operation effects, such as substrate current and loss of saturation current, are compensated for. A current reference IREF2 generates the current level bias for the current sources 312 and 316 for the monitor stage 304 and the differential stage 308, respectively. A fixed forward bias current is set from bulk to VSS of each stage by transistors 328 and 332 that are at a fixed bias voltage VBN. However, current variation due to substrate current or other low voltage effects will be detected as the VFB voltage on the diode connected load device 320 on the monitor stage 304. VFB, in turn, drives transistor 324 such that current variation in the monitor stage 304 is compensated by altering the amount of current that is shunted away from the current mirror 340 and 342. Finally, this feedback mechanism compensates the current reference VBPR that drives the main and monitor current sources 316 and 312.

Figure 7:
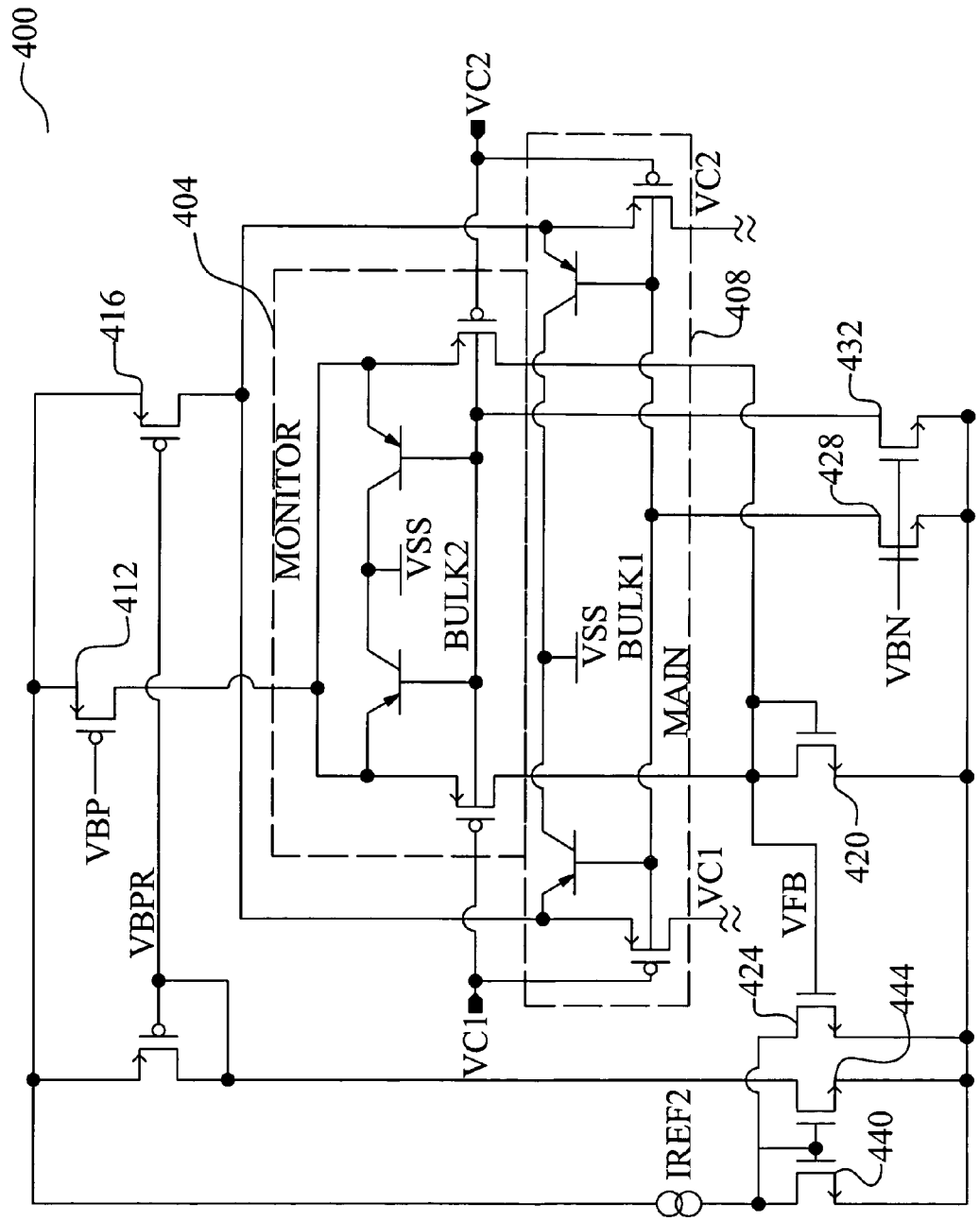
FIG. 7 illustrates a fifth preferred embodiment of the present invention showing a circuit for steering the bias current for the main differential stage.

Referring now to FIG. 7, a fifth preferred embodiment of the present invention is shown. In this variation of the circuit, the input current of the differential stage MAIN is steered. Variation in low current operation effects, such as substrate current and loss of saturation current, are compensated for. A current reference IREF2 generates the current level bias for the current source 416 for the main differential stage 408. However, a fixed current reference VBP is used to establish a fixed current source for the monitor stage 404. Again, fixed forward bias current is set from bulk to VSS of each stage by transistors 428 and 432 that are at a fixed bias voltage VBN. Again, current variation due to substrate current or other low voltage effects will be detected as the VFB voltage on the diode connected load device 420 on the monitor stage 404. VFB, in turn, drives transistor 424 such that current variation in the monitor stage 404 is compensated by altering the amount of current that is shunted away from the current mirror 440 and 442. Finally, this feedback mechanism compensates the current reference VBPR that drives the main current source 416, but not the monitor source 412.

Figure 8:
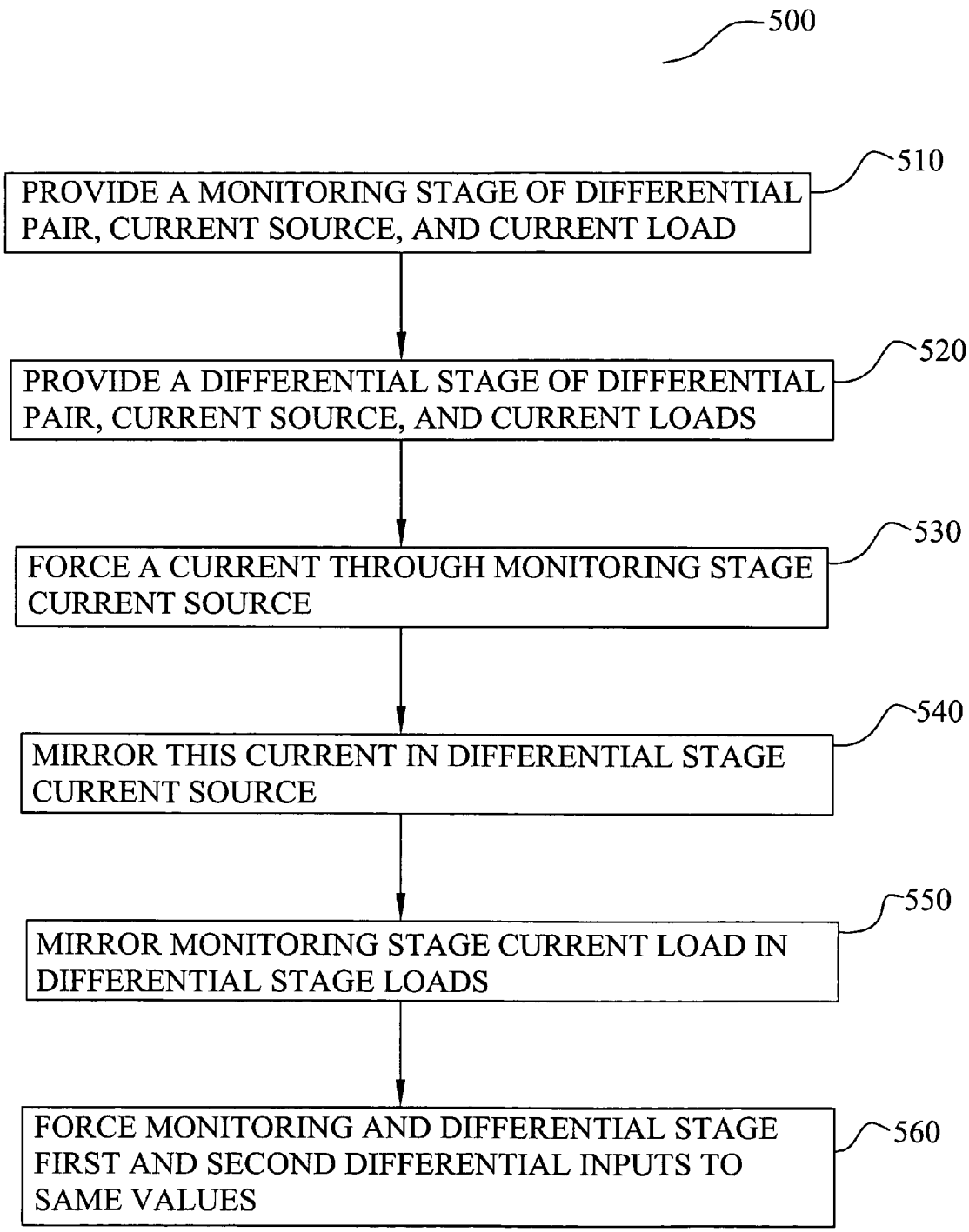
FIG. 8 illustrates a sixth preferred embodiment of the present invention showing a flow chart of the method of improving low voltage performance of a differential gain stage.

Referring now to FIG. 8, a sixth preferred embodiment of the present invention is illustrated. A flow chart is shown for the method to improve the low voltage performance of a differential gain stage is achieved. The method 500 comprises providing a monitoring stage and a differential stage in steps 510 and 520. The monitoring stage comprises a differential transistor pair having a first differential input, a second differential input, an upper current input, and a lower current output. In addition, a current source is connected to the upper current input, and a current load is connected to the lower current output. The differential stage comprises a differential transistor pair having a first differential input, a second differential input, an upper current input, a first lower current output, and a second lower current output. In addition, a current source is connected to the upper current input, a first current load is connected to the first lower current input, and a second current load is connected to the second lower current input. A current is forced through the monitoring stage current source in step 530. The current through the monitoring stage current source is mirrored in the differential stage current source in step 540. Current through the monitoring stage current load is mirrored through the differential transistor stage first and second current loads in step 550. The monitoring stage and the differential stage first differential inputs are forced to the same voltage, and the monitoring stage and the differential stage second differential inputs are forced to the same voltage in step 560.

The advantages of the present invention may now be summarized. An effective and very manufacturable circuit device is achieved. A differential stage circuit device is achieved. The differential stage circuit device is capable of very low voltage operation. Bulk forward biasing of the differential MOS transistor pair improves the low voltage performance of the differential stage circuit device. The differential stage circuit device provides compensation for variation in current source performance due to low voltage headroom. The differential stage circuit device provides compensation for variation in parasitic bipolar current due to bulk forward biasing. A method to provide low voltage operation of the differential stage circuit device is provided.

As shown in the preferred embodiments, the novel circuit devices and methods of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to improve the low voltage performance of a differential gain stage, said method comprising:
   providing a monitoring stage comprising:
      a differential transistor pair having a first differential input, a second differential input, an upper current input, and a lower current output, where said differential transistor pair comprises MOS transistors having bulk terminals, where said bulk terminals are connected together and where a bulk current source is connected to said bulk terminals;
      a current source connected to said upper current input; and
      a current load connected to said lower current output;
   providing a differential stage comprising:
      a differential transistor pair having a first differential input, a second differential input, an upper current input, a first lower current output, and a second lower current output, where said differential transistor pair comprises MOS transistors having bulk terminals, where said bulk terminals are connected together and where a bulk current source is connected to said bulk terminals;
      a current source connected to said upper current input;
      a first current load connected to said first lower current output; and
      a second current load connected to said second lower current output;
   forcing a current through said monitoring stage current source;

mirroring said current through said monitoring stage current source in said differential stage current source;
mirroring current in said monitoring stage current load through said differential transistor stage first and second current loads;
forcing said monitoring stage and said differential stage first differential inputs to the same voltage; and
forcing said monitoring stage and said differential stage second differential inputs to the same voltage.

2. The method according to claim 1 wherein said current sources each comprise a MOS transistor having source connected to a power supply, having drain connected to said upper current input, and having gate connected to a first bias voltage.

3. The method according to claim 2 wherein said step of mirroring current in said monitoring stage current load through said differential transistor stage first and second current loads compensates for said current source MOS transistors leaving saturation operation during a low voltage on said power supply.

4. The method according to claim 1 wherein said current loads each comprise a MOS transistor having source connected to a ground reference.

5. The method according to claim 1 wherein said bulk current source reduces the threshold voltage of said MOS transistors.

6. The method according to claim 1 wherein said step of mirroring current in said monitoring stage current load through said differential transistor stage first and second current loads compensates for variation in parasitic current due to parasitic bipolar effects at said bulk terminals.

7. A differential gain stage device comprising:
a monitoring stage comprising:
a differential MOS transistor pair having a first differential input, a second differential input, an upper current input, and a lower current output;
a current source comprising a transistor having source connected to a power supply and having drain connected to said upper current input,;
a current load comprising a transistor having source connected to a ground reference and having gate and drain connected to said lower current output to thereby generate a voltage bias; and
a bulk current source connected to bulk terminals of said MOS transistor pair; and
a differential stage comprising:
a differential MOS transistor pair having a first differential input, a second differential input, an upper current input, a first lower current output, and a second lower current output wherein said monitoring stage and said differential stage first differential inputs are connected together and wherein said monitoring stage and said differential stage second differential inputs are connected together;
a current source comprising a transistor having source connected to said power supply and having drain connected to said upper current input;
a first current load comprising a transistor having source connected to said ground reference, having gate connected to said voltage bias, and having drain connected to said first lower current output;
a second current load comprising a transistor having source connected to said ground reference, having gate connected to said voltage bias, and having drain connected to said second lower current output; and
a bulk current source connected to the bulk terminals of said MOS transistor pair.

8. The device according to claim 7 wherein said voltage bias affects the value of said monitoring stage current source.

9. The device according to claim 8 wherein said voltage bias affects the value of said differential stage current source.

10. The device according to claim 7 further comprising a shunting transistor having gate connected to said voltage bias wherein said shunting transistor controllably diverts current to thereby alter the value of said monitoring stage current source.

11. The device according to claim 10 wherein said shunting transistor alters the value of said differential stage current source.

12. The device according to claim 7 wherein threshold voltages of said MOS transistors are altered by said bulk current sources.

13. The device according to claim 7 wherein said MOS transistors comprise PMOS transistors and wherein said bulk current sources are further connected to said ground reference.

14. The device according to claim 7 wherein said MOS transistors comprise NMOS transistors and wherein said bulk current sources are further connected to said power supply.

15. The device according to claim 7 wherein said monitoring stage and said differential stage current sources comprise PMOS transistors.

16. The device according to claim 7 wherein said monitoring stage and said differential stage current loads comprise NMOS transistors.

17. The device according to claim 7 further comprising a band gap reference circuit connected to said differential stage.

18. A differential gain stage device comprising:
a monitoring stage comprising:
a differential MOS transistor pair having a first differential input, a second differential input, an upper current input, and a lower current output;
a current source comprising a transistor having source connected to a power supply and having drain connected to said upper current input;
a current load comprising a transistor having source connected to a ground reference and having gate and drain connected to said lower current output to thereby generate a voltage bias; and
a bulk current source connected to bulk terminals of said MOS transistor pair;
a differential stage comprising:
a differential MOS transistor pair having a first differential input, a second differential input, an upper current input, a first lower current output, and a second lower current output wherein said monitoring stage and said differential stage first differential inputs are connected together and wherein said monitoring stage and said differential stage second differential inputs are connected together;
a current source comprising a transistor having source connected to said power supply and having drain connected to said upper current input;
a first current load comprising a transistor having source connected to said ground reference, having gate connected to said voltage bias, and having drain connected to said first lower current output;

a second current load comprising a transistor having source connected to said ground reference, having gate connected to said voltage bias, and having drain connected to said second lower current output; and a bulk current source connected to bulk terminals of said MOS transistor pair; and a shunting transistor having gate connected to said voltage bias wherein said shunting transistor controllably diverts current to thereby alter the value of said monitoring stage current source.

19. The device according to claim 18 wherein said voltage bias affects the value of said differential stage current source.

20. The device according to claim 18 wherein threshold voltages of said MOS transistors are altered by said bulk current sources.

21. The device according to claim 18 wherein said MOS transistors comprise PMOS transistors and wherein said bulk current sources are further connected to said ground reference.

22. The device according to claim 18 wherein said MOS transistors comprise NMOS transistors and wherein said bulk current sources are further connected to said power supply.

23. The device according to claim 18 wherein said monitoring stage and said differential stage current sources comprise PMOS transistors.

24. The device according to claim 18 further comprising a band gap reference circuit connected to said differential stage.

* * * * *